(12) United States Patent
Ahn et al.

(10) Patent No.: US 7,041,341 B2
(45) Date of Patent: *May 9, 2006

(54) PROCESS FOR THE FABRICATION OF OXIDE FILMS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/945,535

(22) Filed: Sep. 20, 2004

(65) Prior Publication Data
US 2005/0118354 A1 Jun. 2, 2005

Related U.S. Application Data

(63) Continuation of application No. 10/217,212, filed on Aug. 9, 2002, now Pat. No. 6,858,120, which is a continuation of application No. 09/810,368, filed on Mar. 15, 2001, now Pat. No. 6,454,912.

(51) Int. Cl.
*C23C 14/00* (2006.01)
*C23C 16/00* (2006.01)
*C23C 16/52* (2006.01)

(52) U.S. Cl. ............... 427/569; 427/248.1; 427/255.23; 427/255.36; 427/255.19; 204/192.12; 204/192.15; 118/723 R

(58) Field of Classification Search ............ 427/248.1, 427/255.23, 255.26, 255.19, 569; 204/192.12, 204/192.15; 118/723 R
See application file for complete search history.

(56) References Cited

U.S. PATENT DOCUMENTS

| | | | |
|---|---|---|---|
| 5,965,192 A | 10/1999 | Potter | |
| 6,083,363 A * | 7/2000 | Ashtiani et al. | ......... 204/298.01 |
| 6,287,430 B1 * | 9/2001 | Matsumoto et al. | ... 204/192.26 |
| 6,454,912 B1 | 9/2002 | Ahn et al. | |
| 6,498,362 B1 | 12/2002 | Forbes et al. | |

OTHER PUBLICATIONS

Akira Onodera, et al., *Ferroelectric Properties in Piezoelectric Semiconductor* $Zn_{1-x}M_xO(M=Li, Mg)$, Japanese Journal of Applied Physics, vol. 36, Part 1, No. 9B (1997), pp. 6006 to 6011.

(Continued)

*Primary Examiner*—Timothy Meeks
*Assistant Examiner*—Howard Abramowitz
(74) *Attorney, Agent, or Firm*—Knobbe, Martens Olson & Bear, LLP

(57) ABSTRACT

The present invention is related to methods and apparatus for processing weak ferroelectric films on semiconductor substrates, including relatively large substrates, e.g., with 300 millimeter diameter. A ferroelectric film of zinc oxide (ZnO) doped with lithium (Li) and/or magnesium (Mg) is deposited on a substrate in a plasma assisted chemical vapor deposition process such as an electron cyclotron resonance chemical vapor deposition (ECR CVD) process. Zinc is introduced to a chamber through a zinc precursor in a vaporizer. Microwave energy ionizes zinc and oxygen in the chamber to a plasma, which is directed to the substrate with a relatively strong field. Electrically biased control grids control a rate of deposition of the plasma. The control grids also provide Li and/or Mg dopants for the ZnO to create the ferroelectric film. A desired ferroelectric property of the ferroelectric film can be tailored by selecting an appropriate composition of the control grids.

10 Claims, 2 Drawing Sheets

OTHER PUBLICATIONS

Junichi Nishino, et al., *Preparation of Zinc Oxide Films by Low-Pressure Chemical Vapor Deposition Method*, Materials Research Society Symposium Proceedings, vol. 363 (1995), pp. 219 to 224.

Rusli, et al., *Investigation of Tungsten Incorportated Amorphous Cabon Film*, Thin Solid Films, vol. 355-356 (1999), pp. 174-178.

Rusli, et al., *Influence of Process Pressure on the Growth of Hydrocarbon Films Under Direct DC Bias in an Electron Cyclotron Resonance Plasma*, Journal of Applied Physics, vol. 84, No. 9 (Nov. 1, 1996), pp. 5277 to 5282.

S.F. Yoon, et al., *Deposition of Diamond-Like Carbon Films Using the Screen Grid Method in Electron Cyclotron Resonance Chemical Vapor Deposition*, Journal of Vacuum Science and Technology A 17(1) (Jan./Feb. 1999), pp. 121 to 124.

Baosheng Sang, et al., *Highly Stable ZnO Thin Films by Atomic Layer Deposition*, Japanese Journal of Applied Physics, vol. 37, Part 2, No. 10A (Oct. 1, 1998), pp. L1125 to L1128.

S.F. Yoon, et al., *Influence of Substrate Temperature and Microwave Power on the Properties of a-C:H Films Prepared Using the ECR-CVD Method*, Diamond and Related Materials, vol. 6 (1997), pp. 1683 to 1688.

* cited by examiner

PROCESS FOR THE FABRICATION OF OXIDE FILMS

RELATED APPLICATION

This application is a continuation application of U.S. application Ser. No. 10/217,212, entitled "METHOD AND APPARATUS FOR THE FABRICATION OF FERROELECTRIC FILMS," filed Aug. 9, 2002 now U.S. Pat. No. 6,858,120, which is a continuation of U.S. application Ser. No. 09/810,368, entitled "METHOD AND APPARATUS FOR THE FABRICATION OF FERROELECTRIC FILMS," filed Mar. 15, 2001, now U.S. Pat. No. 6,454,912, Issued Sep. 24, 2002, the entireties of which are hereby incorporated by reference herein.

BACKGROUND OF THE INVENTION

1. Field of the Invention

The present invention is generally related to semiconductor processing. In particular, the present invention relates to processing ferroelectric films.

2. Description of the Related Art

A ferroelectric material is a material that exhibits an ability to maintain an electric polarization in the absence of an applied electric field. Ferroelectric materials also exhibit piezoelectricity, where the material changes polarization in response to a mechanical pressure or strain, and pyroelectricity, where the material changes polarization in response to a temperature change.

The foregoing properties of ferroelectric materials have led to many practical applications. One application uses the ability of the ferroelectric material to retain a polarization state to store data in a non-volatile memory device.

A film of zinc oxide (ZnO) doped with lithium (Li) and/or magnesium (Mg) is known to form a weak ferroelectric film, Akira Onodera, et al., *Ferroelectric Properties in Piezoelectric Semiconductor $Z_{n1}-xM_xO$ ($M=Li$, $Mg$)*, 36 Japan J. Appl. Phys. 6008 (1997). In a prior patent application, Applicants disclosed a non-volatile semiconductor memory fabricated from a doped ZnO film, Weak Ferroelectric Memory Transistor, application Ser. No. 09/383,726, filed Aug. 26, 1999, the entirety of which is hereby incorporated by reference.

ZnO in stoichiometric form is an electrical insulator. Conventional methods of doping host ZnO with Li and/or Mg to form ferroelectric films have proven inadequate. Conventional methods are not well suited to the doping of host ZnO with Li and/or Mg for relatively large scale operations with wafers of approximately 300 millimeters (about 12 inches) or larger.

Magnetron sputtering is a conventional method of doping ZnO with Li and/or Mg. In magnetron sputtering, a target produced from a composition of ZnO and Li and/or Mg is introduced into a sputtering system. The composition can be made from ZnO with strips or particles of Li and /or Mg. Powder metallurgy can also be used to create the target.

A magnetron sputtering system creates a plasma, which reacts with the surface of the target to create the film. Disadvantageously, the film composition cannot be fine-tuned because the doping levels of Li and/or Mg are dictated by the initial composition of the target. Another disadvantage of magnetron sputtering is that relatively large targets, such as 300-millimeter targets, are relatively difficult to produce using powder metallurgy. A further disadvantage of magnetron sputtering with powder metallurgy is that the purity of ZnO in a powdered metal target process is relatively lower than the purity of ZnO that is attainable from a zone-refined process.

Jet vapor deposition (JVD) is another conventional method of forming a ZnO film (with or without doping of Li and/or Mg) on a substrate. In a JVD process, jets of a light carrier gas, such as helium, transport the depositing vapor of ZnO to the substrate. Uniformity of the thickness of the deposited film can require the JVD process to move and rotate the substrate relative to the jet nozzles in a complex mechanical motion. The chamber performing the JVD process can quickly grow to relatively large and expensive proportions as the chamber holding the substrate should be at least twice the diameter of the substrate wafer to accommodate the complex mechanical motion. Further, a JVD process does not permit the tailoring of the Li and/or Mg doping of the ZnO to conform the ZnO film to a desired ferroelectric characteristic.

Low-pressure chemical vapor deposition (LP-CVD) is still another conventional method of growing a ZnO film, with or without Li and/or Mg doping, on a substrate. As with the above-noted processes, the LP-CVD process also does not permit the tailoring of the Li and/or Mg doping of the ZnO to conform the ZnO film to a desired ferroelectric characteristic is not easy.

Thus, conventional methods are not well adapted to produce ferroelectric films on large wafers. The processing of ferroelectric films on large wafers of substrate can dramatically reduce a per-unit cost of chips made from the wafers. Conventional methods are also not well adapted to permit the uniform tailoring of the deposited ZnO composition to permit the tailoring of the ZnO film to a desired ferroelectric characteristic.

SUMMARY OF THE INVENTION

The present invention is related to methods and apparatus for processing weak ferroelectric films on semiconductor substrates. A ferroelectric film of zinc oxide (ZnO) doped with lithium (Li) and/or magnesium (Mg) is deposited on a substrate in an electron cyclotron resonance chemical vapor deposition (ECR CVD) process. An embodiment according to the invention advantageously permits the fabrication of relatively large (about 300 millimeters in diameter) substrates, which allows more devices to be fabricated at the same time, i.e., enhances economies of scale.

In accordance with one embodiment of the present invention, the zinc is introduced to a chamber through a zinc precursor in a vaporizer. Argon gas transports the zinc to the chamber. Microwave energy ionizes zinc and oxygen in the chamber to a plasma, which is directed to the substrate with a relatively strong magnetic field. Electrically biased control grids provide a control of a rate of deposition of the plasma on the substrate. The control grids also provide Li and/or Mg dopants for the ZnO to create the ferroelectric film. The properties of the ferroelectric film can be conveniently tailored by selecting the composition, height, spacing and/or applied voltage of the control grid, which acts as a source of dopant, e.g., Li and/or Mg, for the ZnO film.

BRIEF DESCRIPTION OF THE DRAWINGS

These and other features of the invention will now be described with reference to the drawings summarized below. These drawings and the associated description are provided to illustrate preferred embodiments of the invention, and not to limit the scope of the invention.

DETAILED DESCRIPTION OF PREFERRED EMBODIMENTS

Although this invention will be described in terms of certain preferred embodiments, other embodiments that are apparent to those of ordinary skill in the art, including embodiments which do not provide all of the benefits and features set forth herein, are also within the scope of this invention. Accordingly, the scope of the present invention is defined only by reference to the appended claims.

An embodiment according to the invention includes a plasma enhanced or assisted chemical vapor deposition system, more particularly, an electron cyclotron resonance chemical vapor deposition (ECR CVD) system, which uniformly deposits a thin film of ferroelectric material having a controlled doping level. In the illustrated embodiment, the material comprises zinc oxide (ZnO) with controlled amounts of metal doping, specifically lithium (Li) and/or magnesium (Mg), on a relatively large wafer. The production of the ferroelectric film on the relatively large wafer can result in a dramatic reduction to production costs as more devices can be formed at a time. For example, if a diameter of a given wafer doubles, the surface area of the wafer quadruples and can thereby accommodate approximately four times the number of devices. The ECR CVD system can control the doping of the Li and/or Mg such that the ferroelectric characteristics of the ZnO can be tailored to a desired characteristic. The tailoring of the ferroelectric characteristics further enhances the yield of processed wafers.

Figure 1:
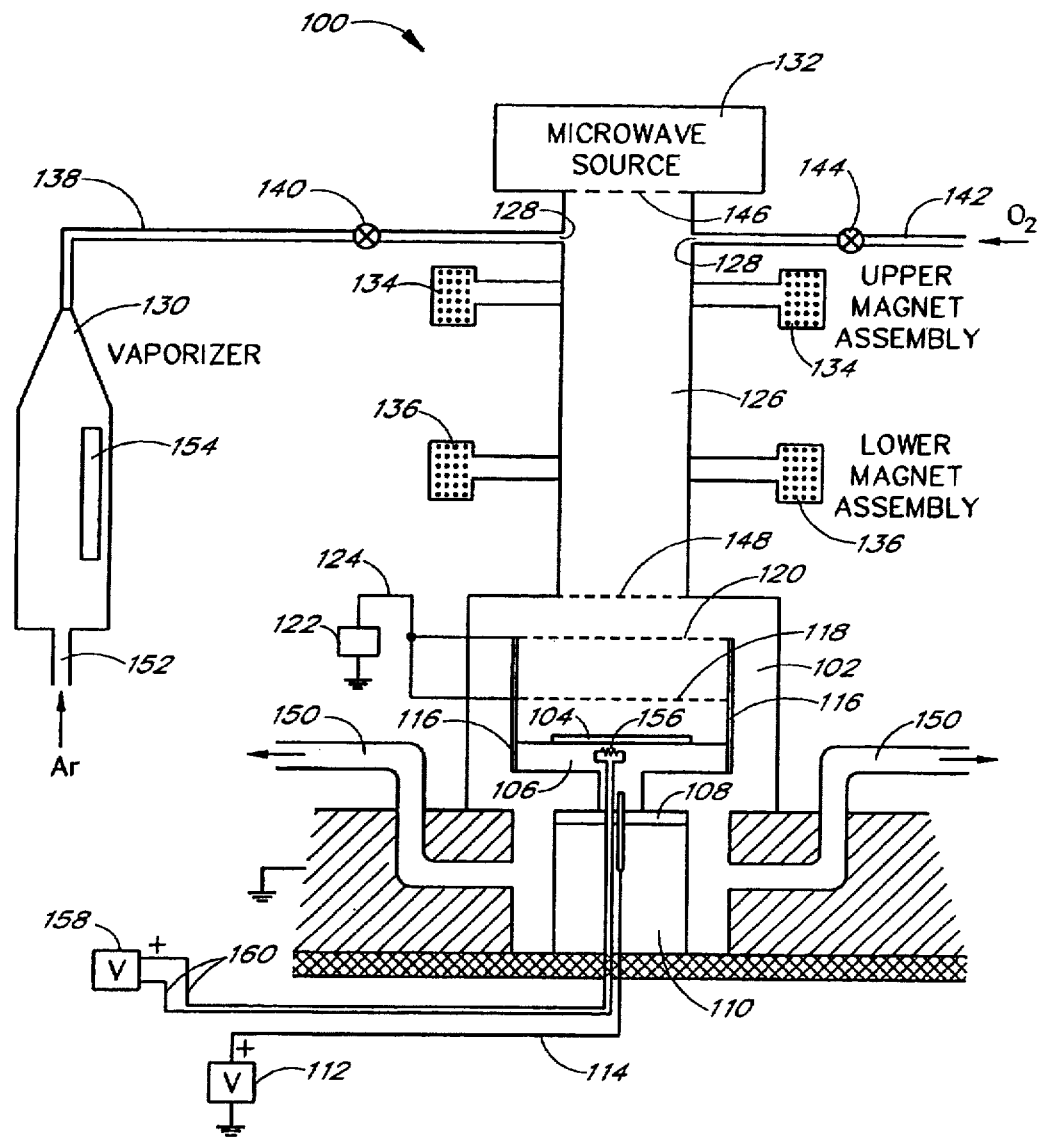
FIG. 1 is an electron cyclotron resonance chemical vapor deposition system according to an embodiment of the present invention.

FIG. 1 illustrates an ECR CVD system 100 (not to scale) according to one embodiment of the invention. The ECR CVD system is a plasma deposition technique, which also includes plasma assisted CVD and plasma enhanced CVD. The ECR CVD system 100 includes a deposition chamber 102, where a substrate 104 is processed. Desirably, the chamber 102 is configured to support a single wafer or substrate 104, in accordance with state-of-the-art integrated circuit (IC) fabrication. In addition, the chamber 102 can be configured to support a small number of substrates, e.g., less than 5 substrates, facing the deposition sources. Generally, the components the ECR CVD system 100 can be fabricated from a variety of materials including stainless steel. The deposition chamber 102 can be formed within a cavity of fused quartz. Of course, the ECR CVD system 100 includes an access door or port to provide access to the deposition chamber 102 for loading and unloading substrates.

The substrate 104 is placed on a substrate support, chuck or tray 106, which rests on an insulator 108 that attaches to a stand 110. The tray 106 is preferably slightly larger in diameter than the substrate 104. For example, where the substrate 104 is 300 millimeters (mm) in diameter, the tray can be 35 centimeters (cm) in diameter. The tray 106, and thereby the substrate 104, can be connected to an external first power supply 112 through a first conductor 114. The tray 106 further provides attachment for guides 116, which support a first grid 118 and a second grid 120. The first and second grids 118, 120 are connected to a second power supply 122 through a second conductor 124. The tray 106 further includes a heat source 156.

The ECR CVD system 100 further includes a plasma generator in the form of an electromagnetic excitation chamber 126. Reactant source gases are communicated to the excitation chamber 126 by reactant gas inlets 128, which in the illustrated embodiment communicate with a vaporizer 130. The electromagnetic excitation chamber 126 also communicates with a microwave source 132, an upper magnet assembly 134, and a lower magnet assembly 136. The vaporizer 130 connects to at least one of the reactant gas inlets 128 via a first passage 138 and a mass flow controller or first valve 140. A second passage 142 and a second valve 144 couple another reactant gas inlet 128, or a manifold leading to a common inlet, to an oxygen source. In the illustrated ECR CVD system 100, the microwave source 132 couples to the electromagnetic excitation chamber 126 through a quartz window 146. The upper and lower magnet assemblies 134, 136 can be attached to the electromagnetic excitation chamber 126 to create a magnetic field therein. The dashed line 148 indicates the division between the deposition chamber 102 and the electromagnetic excitation chamber 126. The electromagnetic excitation chamber 126 is also known as a microwave plasma chamber.

The operation of the ECR CVD system 100 will now be described with reference to FIG. 1.

After the substrate 104 is placed on the chuck or tray 106 and the ECR CVD system 100 has been sealed, the deposition chamber 102 is brought to a vacuum through vacuum pumps connected to evacuation outlets 150. In one embodiment, the system is first evacuated to a base pressure below $2 \times 10^{-6}$ Torr using a turbomolecular pump.

Argon or other carrier gas is introduced into the vaporizer 130 through a vaporizer inlet 152. The vaporizer 130 contains a first source material 154, such as $Zn(C_5H_7O_2^-)_2$ or $Zn(acac)_2$, where acac is acetyl acetonate. $Zn(C_5H_7O_2^-)_2$ is a precursor providing Zn. In one embodiment, the vaporizer 130 maintains the first source material 154 at approximately 105 degrees Celsius (C).

The argon gas carrier introduces the Zn precursor into the electromagnetic excitation chamber 126 through the reactant gas inlet 128. The first valve 140 controls the rate by which Zn is introduced into the electromagnetic excitation chamber 126 by controlling the rate at which argon flows through the vaporizer 130. In one embodiment, argon flows through the vaporizer 130 at approximately 100 cubic centimeters per minute.

In the illustrated embodiment, a second reactant comprising a source of oxygen, such as diatomic oxygen ($O_2$) or ozone ($O_3$), is also introduced into the electromagnetic excitation chamber 126 via the reactant gas inlet 128. The second valve 144 controls the flow of oxygen source or precursor gas from the second passage 142, which leads to the oxygen source. In one embodiment, the oxygen precursor comprises $O_2$ and the oxygen flow is approximately 2 cubic decimeters per minute. Varying the rate of gas flow and/or the gas flow ratio varies a rate of deposition of the dopants.

During deposition, the vacuum pumps and the first and the second valves 140, 144 maintain the pressure in the deposition chamber 102 at a relatively low vacuum, such as from 7 to 24 milliTorr (mTorr). The pressure can vary widely, but higher pressures tend to weaken the electron cyclotron resonance effect and reduce the density of the plasma generated by the microwave source 132. In one embodiment, the pressure in the deposition chamber 102 is maintained at 6 mTorr, although it can be monitored and maintained between about 7 mTorr to about 25 mTorr.

The microwave source 132 generates relatively high-powered microwaves, which are coupled to the electromagnetic excitation chamber 126 through the quartz window 146. The microwave source 132 can be remotely located from the electromagnetic excitation chamber 126 and coupled to the quartz window 146 with a waveguide. In one embodiment, the microwave source 132 is a magnetron that transmits approximately 300 to 400 Watts of microwave power to the electromagnetic excitation chamber 126 at a frequency of approximately 2.45 gigahertz (GHz). The energy is coupled to the reactant gases, breaking down Zn and oxygen precursors in the electromagnetic excitation chamber 126 to generate plasma ions and neutral radicals.

The upper magnet assembly 134 and the lower magnet assembly 136 induce a relatively powerful magnetic field within the electromagnetic excitation chamber 126. The upper magnet assembly 134 and the lower magnet assembly 136 can be fabricated from solenoids, where the windings of the solenoids wrap around the electromagnetic excitation chamber 126 as shown in FIG. 1. A magnetic flux density of approximately 875 Gauss produced in the middle of the electromagnetic excitation chamber 126 suffices to allow an electron cyclotron resonance.

Of course, the magnetic field produced by a solenoid can vary with the current and the number of turns of wire in the solenoid. In one embodiment, the current drive to an upper solenoid embodying the upper magnet assembly 134 is approximately 20% greater than a current drive to a lower solenoid embodying the lower magnet assembly 136 such that the upper solenoid produces a greater magnetic field than the lower solenoid and thereby accelerates or propels ions within the plasma toward the deposition chamber 102. For example, the current drive to the upper and the lower solenoids can conform to approximately 120 Amps and 100 Amps, respectively.

The ferroelectric film is deposited on the substrate 104 in the deposition chamber 102. The substrate 104 rests on a tray 106, which is preferably heated by the heat source 156. The tray 106 can be fabricated from a material that is conductive to heat, such as a ceramic, such that the heat from the heat source 156 is relatively evenly distributed. One embodiment of a heat source 156 passes a current through a resistive wire, such as NiChrome. A third power supply 158 sources the current through wires 160. The heat supplied can vary in accordance with the power applied to the resistive wire by the third power supply 158. Of course, the tray 106 can further include a temperature sensor, such as a thermocouple or temperature sensitive resistor, to monitor and/or control the temperature of the tray 106. In one embodiment, the heat source 156 maintains the temperature of the tray 106 and the substrate 104 within a range of approximately 350 degrees C. to 650 degrees C. The skilled artisan will also appreciate that the substrate 104 can be otherwise heated (e.g., inductively or radiantly).

The rate at which ZnO is deposited on the substrate can be controlled by a position, a dimension, and a bias of the first and the second grids 118, 120. The first and the second grids 118, 120 also introduce a second source material that is sputtered on the substrate. The second source material is a metal dopant, preferably Li and/or Mg, which combines with the dielectric ZnO to produce the ferroelectric film. Further details of a wire screen 200 that can form the first and the second grids 118, 120 are described below in connection with FIG. 2.

The first and the second grids 118, 120 attach to the guides 116, which hold the first and the second grids 118, 120 above the substrate 104. In one embodiment, the guides 116 are four insulating poles fabricated from an insulating polyimide polymer such as Vespel® from E. I. du Pont de Nemours and Company. The spacing between the first and the second grids 118, 120 and the spacing between the first grid 118 and the substrate 104 can be adjusted along the guides 116 to vary the rate of deposition. Preferably, the spacing between the first and the second grids 118, 120 ranges from approximately 3 cm to 7 cm. More preferably, the spacing between the first and the second grids 118, 120 ranges from approximately 4 cm to 6 cm. In one embodiment, the spacing between the first and the second grids 118, 120 is approximately 5 cm. Preferably, the spacing between the first grid 118 and the substrate 104 ranges from approximately 2 cm to 5 cm. More preferably, the spacing between the first grid 118 and the substrate 104 ranges from approximately 2 cm to 3 cm. In one embodiment, the spacing between the first grid 118 and the substrate 104 is approximately 3 cm.

Electrically, the first and the second grids 118, 120 can be connected and biased through the second wire 124 and the second power supply. In one embodiment, the voltage range for the biasing of the first and the second grids 118, 120 is approximately −300 to −350 Volts direct current (Vdc) relative to ground. In another embodiment, the first and the second grids 118, 120 are not shorted together, but are connected to their own power supplies. Although smaller voltages can be used, the relatively large voltage range of −300 to −350 Vdc advantageously reduces the coating of the first and the second grids 118, 120 during the deposition process, which would otherwise reduce the incorporation of the Li and/or Mg in the ferroelectric film.

The insulator 108 isolates the tray 106 and the substrate 104 from ground potential. One embodiment of the insulator 108 is fabricated from a quartz plate. The insulator 108 permits biasing of the substrate 106 to a potential other than ground through the first conductor 114 and the first power supply 112. In one embodiment, the voltage range for the biasing of the substrate is approximately 0 to −50 Vdc. Of course, the substrate 104 and the tray 106 can simply be grounded without the insulator 108 when 0 Vdc is selected as the biasing of the substrate.

Figure 2:
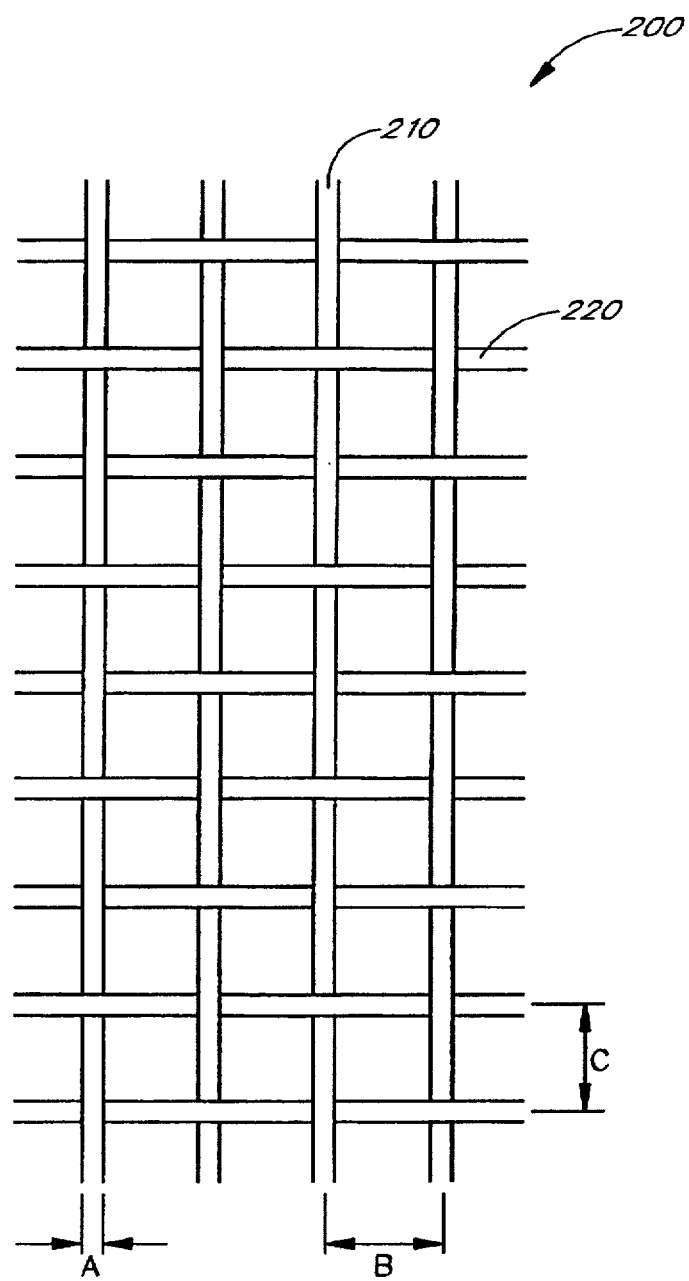
FIG. 2 is a top-view of a wire screens.

FIG. 2 illustrates a portion of the wire screen 200 according to one embodiment of the first and the second grids 118, 120. To reduce edge effects, the first and the second grids 118, 120 are preferably circular in shape and larger in diameter than the diameter of the substrate 104. For example, where the substrate 104 is 300 mm in diameter, the first and the second grids 118, 120 can be 35 cm in diameter.

The portion of the wire screen 200 shown illustrates interwoven wires 210, 220. The diameter of the wire, represented by A in FIG. 2, and the spacing between wires, represented by B and C in FIG. 2, also varies the rate of deposition. The spacing between wires preferably ranges from 3 mm to 5 mm, and more preferably from 4 mm to 5 mm. The wire diameter ranges preferably from 0.5 mm to 1.2 mm, and more preferably from 1.0 mm to 1.2 mm. In one embodiment, for processing 300-mm wafers, the diameter of the wire, A, is in the range of approximately 0.5 to 1.0 mm and the spacing between the wires, B and C, is about 5 mm.

The wires are made from the desired dopant or dopants, specifically Li, Mg, or a combination of the two in the illustrated embodiment. Advantageously, the Li and/or Mg for the wires can be produced by a relatively high purity process, such as a zone-refined process. Material from the wires is deposited on the substrate 104 together with the ZnO as dopants to the ZnO to produce the ferroelectric film. Where the first and the second grids 118, 120 include both Li and Mg, the ratio of the Li to Mg in the first and the second grids 118, 120 controls the ratio of the Li to Mg doping of the ferroelectric film. The ferroelectric properties of the ferroelectric film can thereby be conveniently tailored by selecting the desired ratio of Li to Mg in the first and the second grids, 118, 120.

The resulting film exhibits ferroelectric properties. In one embodiment, the ferroelectric film is characterized by the general formula of $Zn_x(Li_yMg_z)O$, where x preferably ranges from approximately 0.70 to 0.99, y and z can independently range from approximately 0.00 to 0.30, and x, y, and z substantially sum to 1. More preferably, x ranges from approximately 0.80 to 0.95, y ranges from approximately 0.01 to 0.05, z ranges from approximately 0.04 to 0.15, and x, y, and z again substantially sum to 1. In one embodiment, x is about 0.9, y is about 0.02, and z is about 0.08.

Embodiments of the present invention advantageously permit the fabrication of ferroelectric films on large substrates with high purity components and at relatively easily varied and controlled conditions. The control over the process allows for relatively high yields, which can lower production costs. A large substrate further allows more devices to be fabricated at the same time, further reducing overall production costs.

Various embodiments of the present invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

We claim:

1. A plasma assisted chemical vapor deposition process for forming a ferroelectric material film on a substrate, the process comprising:
generating plasma products of oxygen and metal in a plasma chamber;
propelling the plasma products towards the substrate;
providing a control grid of a dopant source material, where the control grid is disposed between the plasma chamber and the substrate such that plasma products pass through at least a portion of the control grid; and
electrically biasing the control grid to control a rate of deposition on the substrate, where the ferroelectric material film formed comprises metal, oxygen, and dopant source material sputtered from the control grid.

2. The process as defined in claim 1, wherein the control grid comprises a wire screen.

3. The process as defined in claim 1, wherein the dopant source material comprises lithium.

4. The process as defined in claim 1, wherein the dopant source material comprises magnesium.

5. The process as defined in claim 1, wherein the dopant source material comprises both lithium and magnesium.

6. The process as defined in claim 1, wherein the dopant source material comprises a combination of lithium and magnesium, where the ratio of lithium to magnesium in the dopant source material approximately corresponds to a desired doping ratio of lithium and magnesium.

7. The process as defined in claim 1, wherein the oxide film comprises a ferroelectric film.

8. The process as defined in claim 1, wherein generating plasma products comprises ionizing a vaporized metal precursor and ionizing oxygen.

9. The process as defined in claim 1, wherein the control grid is biased to about −300 to −350 Volts direct current (Vdc) relative to ground.

10. The process as defined in claim 1, further comprising biasing the substrate within a range of about 0 to −50 Volts direct current (Vdc) relative to ground.

* * * * *